(12) United States Patent
Johansson et al.

(10) Patent No.: US 6,236,218 B1
(45) Date of Patent: May 22, 2001

(54) METHOD AND A DEVICE FOR SPACE-CHARGE MEASUREMENT IN CABLES USING A PULSED ELECTROACOUSTIC METHOD

(75) Inventors: Kenneth Johansson; Christer Törnkvist, both of Västerås (SE)

(73) Assignee: ABB Research Ltd., Västerås (SE)

(*) Notice: Subject to any disclaimer, the term of this patent is extended or adjusted under 35 U.S.C. 154(b) by 0 days.

(21) Appl. No.: 09/142,693
(22) PCT Filed: Mar. 13, 1997
(86) PCT No.: PCT/SE97/00435
§ 371 Date: Sep. 14, 1998
§ 102(e) Date: Sep. 14, 1998
(87) PCT Pub. No.: WO97/34159
PCT Pub. Date: Sep. 18, 1997

(30) Foreign Application Priority Data

Mar. 15, 1996 (SE) .................................. 9600989

(51) Int. Cl.[7] .................................. G01R 31/08
(52) U.S. Cl. .................................. 324/536; 324/542
(58) Field of Search .................................. 324/536, 542, 324/544, 547, 557, 529, 541

(56) References Cited

U.S. PATENT DOCUMENTS 5,608,328 * 3/1997 Sanderson .................. 324/529
5,767,684 * 6/1998 Steennis .................. 324/536
5,854,556 * 12/1998 Steennis et al. .................. 324/536

FOREIGN PATENT DOCUMENTS 6-74999   3/1994 (JP).
7-20181   1/1995 (JP).

OTHER PUBLICATIONS

N. Hozomi, T. Okamoto, T. Imajo, "Space charge distributi on measurement in a long size XLPE cable using the pulsed electroacoustic method", Conference Record of the 1992 IEEE International Symposium on Electrical Insulation, Baltimore, Jun. 7–10, 1992, pp 294–297.

* cited by examiner

Primary Examiner—Safet Metjahic
Assistant Examiner—T. R. Sundaram
(74) Attorney, Agent, or Firm—Dykema Gossett PLLC

(57) ABSTRACT

A method for space-charge measurement in a coaxial cable comprising an inner conductor (2), a cable screen (3) and an electric insulation (4) between the inner conductor and the cable screen, wherein the cable screen is removed on both sides of a measurement region, an electric voltage pulse is generated by an electric pulse generator (10) and is applied over part of the insulation (4) of the cable within the measurement range, an acoustic signal, in the presence of space charges in the cable insulation, is generated by the voltage pulse in cooperation with the space charges and a possible acoustic signal is recorded by a sound-recording device (8). A grounded annular outer electrode (7) is applied around the measurement region, the sound-recording device is arranged in direct contact with the annular outer electrode, the voltage pulse is applied to the cable screen on both sides of the measurement region and is connected, via the impedance of the cable, to the inner conductor of the cable.

16 Claims, 2 Drawing Sheets

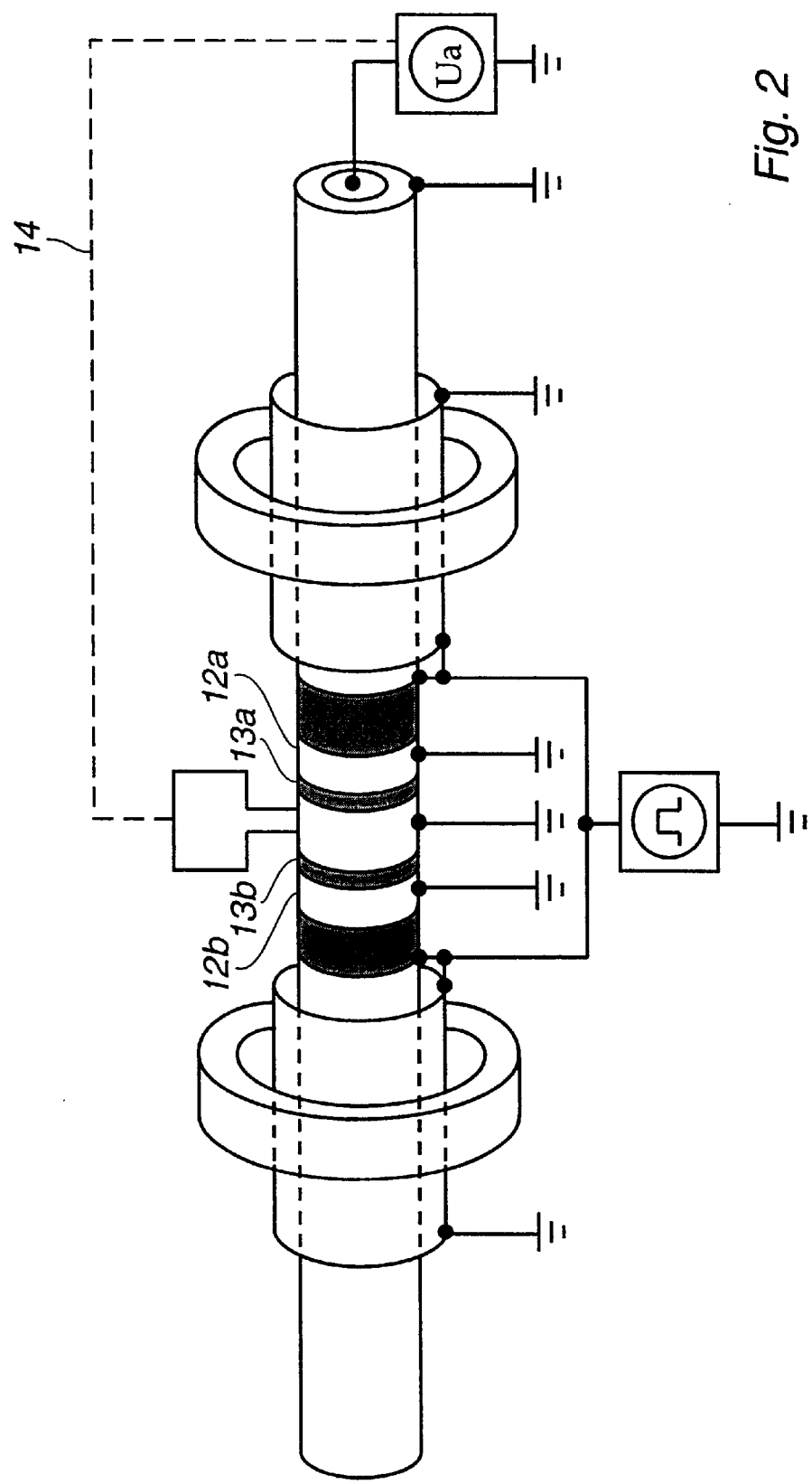

METHOD AND A DEVICE FOR SPACE-CHARGE MEASUREMENT IN CABLES USING A PULSED ELECTROACOUSTIC METHOD

TECHNICAL FIELD

The present invention relates to a method and a device for measurement of space charges in an electrical insulation of a cable using a pulsed electroacoustic method, where space charges in the insulation of the cable are set in motion by an electric pulse and where this motion generates acoustic waves which are registered and evaluated with respect to the space-charge distribution in the insulation of the cable.

BACKGROUND ART

When using polymeric insulating material with a high specific resistance, for example polyethylene, space charges may form within the material. These space charges distort the electric field in the insulating material and this causes electrical breakdown at a lower average field strength than without these space charges. This problem becomes especially pronounced for electrical insulation which is subjected to high direct voltage, in particular cables for transmission of high-voltage direct current.

To ascertain the generation and distribution of the space charge within the insulating material, a need has arisen to provide a non-destructive method which may provide a picture of the space-charge distribution within the insulating material in a manner similar to that in which, for example, the emission of X-rays or ultrasonics is used to demonstrate variations in the material composition of a test specimen.

Two methods which may be used for non-destructive space-charge measurement are the pressure-wave propagation method, PWP, and the pulsed electroacoustic method, PEA.

In the PWP method, the material is subjected to a mechanical pulse, which generates an acoustic wave which during the propagation "shakes" space charges. This generates a current signal between short-circuited electrodes or a voltage signal over open electrodes which surround the insulating material, which signal is then evaluated with respect to the space-charge distribution.

In the PEA method, the material is subjected to a short electric voltage pulse between two electrodes which surround the insulating material, and the force exerted by the thus caused electric field on the space charge "shakes" the insulating material. This mechanical displacement propagates through the material as an acoustic wave which is detected, for example with a piezoelectric transducer, and is then evaluated with respect to the space-charge distribution.

A good summary of the prior art relating to the PEA method is given in the publication by N. Hozumi, T. Okamoto and T. Imajo: "Space charge distribution measurement in a long size XLPE cable using the pulsed electroacoustic method", Proc. of IEEE Symposium on EL. Ins. 1992, pp. 294–297, Baltimore, Jun. 7–10, 1992.

The original method makes use of parallel plates as electrodes with the insulating material to be tested between these. One of the electrodes is in mechanical contact with a plate of piezoelectric material which converts the acoustic signal into an electrical signal. When changing to a cylindrical geometry, with an inner electrode which is concentrically surrounded by insulating material, which in turn is surrounded by an outer conducting layer, short pieces of cable may be tested using the PEA method. The inner electrode consists of the inner conductor of the cable, the outer electrode of a sector-shaped aluminium block in mechanical contact with the semiconducting layer which is applied onto the cable insulation. The aluminium block is mechanically connected to a piezoelectric PVDF film which, in a manner previously described, generates an electrical signal when hit by the acoustic wave.

To achieve a sufficiently high resolution during the space-charge measurement, the pulse length of the electric pulse must be short compared with the time needed by a acoustic pulse to propagate through the insulating material over the electrode distance. This entails pulses with a duration of a few 10 ns, in which case the frequency contents of the pulse will primarily be within the range of 10–100 MHz. Since the space-charge measurement is to be carried out during simultaneous application of a high direct voltage to the inner conductor of the cable, both the coupling capacitor for the pulse application and the end termination of the cable become large in their linear dimensions and therefore constitute a relatively great inductance, which greatly influences the pulse shape. To be able to carry out space-charge measurements on longer cable pieces, the outer conductor (metal foil or screen cover) of the cable is removed at the location where the cable is to be tested. In the middle of this zone, without an outer conductor, an annular outer electrode of metal foil is applied, in mechanical contact with an aluminium block as above. The semiconducting layer, which in this context has a high electric resistance, is left intact. The voltage pulse is applied between the annular outer electrode and the outer conductor of the cable and is connected capacitively to the inner conductor through the impedance of the cable. The fact that part of the pulse makes its way through the semiconducting layer reduces its voltage but has otherwise no disturbing influence.

The above method solves the problem of measuring on a long cable. However, this is done at the cost of a new problem:

During the application of the pulse, the annular outer electrode is energized. This pulse voltage pulse must not reach measurement and evaluation equipment located at ground potential. One way of solving the problem is to apply an electrically insulating layer, for example a plastic foil, between the outer electrode and the aluminium block. However, the foil disturbs the propagation of the acoustic signal which now has to pass through the insulating layer. It may also be charged and thereby generate disturbance. Another method, also suggested in the publication, is to allow the measurement equipment to be in electrical contact with the outer electrode and to transmit the measurement signals from there in a potential-free manner with the aid of optical fibres to the evaluation equipment. However, this solution is complicated, resource-demanding and more sensitive to disturbance.

SUMMARY OF THE INVENTION

The invention solves the problem of applying an electric pulse between the inner conductor and the outer conductor of a coaxial cable for pulsed electroacoustic space-charge measurement, independently of the length of the cable and without having to energize the outer conductor which is in contact with the measurement equipment.

This is achieved by applying the outer electrode in the measurement region, in a manner similar to that of the previously described method for measurements of long cables, to the semiconducting layer on the insulation of the cable after the outer conductor has been removed at the measurement region. Then, the electric pulse is applied between the outer conductor of the cable outside the measurement region. The pulse is then connected via the impedance of the cable to the inner conductor of the cable, such that a pulse-shaped voltage will also lie between the inner conductor of the cable and the outer electrode. To prevent the pulse from propagating along the outer conductor of the cable, it is disconnected with the aid of two transformers, one on each side of the measurement region. The transformer is in the form of a metal foil or a metal cover around the cable and an annular magnetizable core, preferably a ferrite toroid, which surrounds the metal foil/cover and the cable. Those parts of the metal foil/cover which are facing away from the measurement region are grounded. The magnetic coupling through the magnetizable core between the metal foil/cover, the outer conductor of the cable and the inner conductor of the cable causes the outer conductor and inner conductor of the cable not to be energized by the voltage pulse outside those parts of the magnetizable cores which are facing away from the measurement region.

BRIEF DESCRIPTION OF THE DRAWINGS

FIG. 2 shows a preferred embodiment of the invention.

DESCRIPTION OF THE PREFERRED EMBODIMENTS

Figure 1:
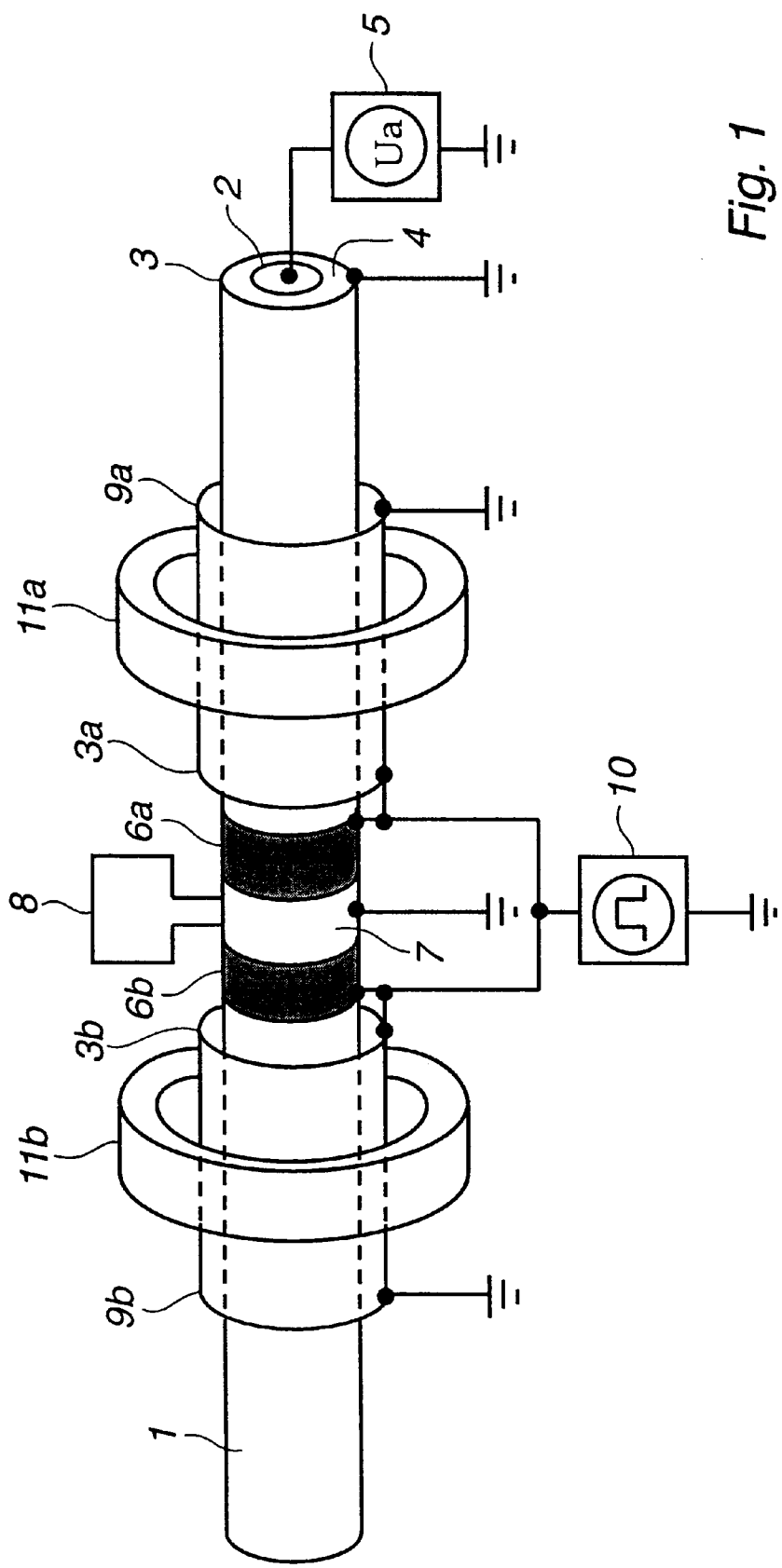
FIG. 1 shows a device for space-charge measurement in a cable according to the invention.

FIG. 1 shows a device according to the invention for space-charge measurement on a cable 1 which comprises an inner conductor 2, a cable screen/outer conductor 3 and an electric insulation 4, preferably made of an organic polymer. The inner conductor may be energized with the aid of a high-voltage source 5. The cable screen is removed on the cable sections on both sides of a measurement region, such that a semiconducting layer 6a, 6b appears which is situated between the insulation of the cable and the cable screen. The measurement region is surrounded by an annular section 7 of the cable screen, which is connected to ground potential. In direct mechanical contact with the section of the cable screen around the measurement region, there is a sound-recording device 8 for recording and amplifying acoustic signals. The device 8 is also in electrical contact with the section 7 and hence at ground potential. On both sides of the measurement region, outside those sections where the cable screen is removed, tubular electrical conductors 9a, 9b are arranged around the cable, and on those ends of the conductors which are facing away from the measurement region, these conductors are connected to ground potential. Those ends of the conductors 9a, 9b and of the cable screen 3a, 3b, which are facing the measurement region, are connected to a pulse generator 10 for generating electric pulses with a short rise time. Around the tubular conductors 9a, 9b, which preferably consist of a piece of screen cover or of metal foil, toroids 11a, 11b of magnetizable material, preferably ferrite, are arranged.

If an electric pulse is applied to the tubular electrical conductors 9a, 9b, it is connected via the impedance of the cable to the inner conductor. The pulse-shaped voltage interacts with those space charges in the insulation between the annular section 7 of the cable screen and the inner conductor which are generated with the high-voltage source 5 through energization of the inner conductor, and generates acoustic pulses which are received by the sound-recording device 8 for evaluation with respect to the magnitude and distribution of the space charge. Through the toroids 11a, 11b, the tubular electrical conductors 9a, 9b, the cable screen 3a, 3b and the inner conductor constitute transformers with the transformation ratio 1:1:1. The voltage drop across the "primary winding", the conductors 9a, 9b between their ends becomes the same as the voltage drop along the cable screen 3a, 3b and along the inner conductor within the magnetic "reach" of the toroid. This means that the pulse does not propagate along the cable outside the "reach" of the toroids. The pulse cannot cause disturbances or be reflected outside the immediate surroundings of the measurement range. The sound-recording device and the annular section 7 of the cable screen are at ground potential and thus need not be insulated electrically, neither from ground nor from each other.

A preferred embodiment according to FIG. 2 comprises annular shielding electrodes 12a, 12b, connected to ground potential, on both sides of the annular section 7, separated from the section 7 through narrow zones 13a and 13b of semiconducting material. This eliminates acoustic disturbances which arise in a device according to FIG. 1 at the boundary between the semiconducting layer 6a, 6b and the annular section 7.

The dashed line 14 in FIG. 2 symbolizes a connection between the sound-recording device 8 and the high-voltage source 5. This connection provides a possibility, during the measurement of the space charge, which may be time-consuming and hence often automated and without supervision, of detecting the sound from major electrical flashovers or breakdowns in the measurement arrangement and, thereafter, of closing the high-voltage source and generating an alarm signal.

What is claimed is:

1. A method for space-charge measurement in a coaxial cable having an inner conductor, a cable screen and an electric insulation between the inner conductor and the cable screen, comprising the steps of:

removing the cable screen on both sides of a measurement range, generating an electric voltage pulse by an electric pulse generator, applying the pulse over part of the insulation of the cable within the measurement range, generating an acoustic signal, in the presence of space charges in the cable insulation, by the voltage pulse in cooperation with the space charges and recording any sensible acoustic signal by a sound-recording device, including disposing a grounded annular outer electrode around the measurement range, arranging the sound-recording device in direct contact with the annular outer electrode, and applying the voltage pulse to the cable screen on both sides of the measurement region and, connecting the pulse to the inner conductor of the cable via the impedance of the cable such that a pulse-shaped voltage will lie between the inner conductor of the cable and the annular outer electrode.

2. A method according to claim 1, further including arranging two tubular electrical conductors on both sides of the measurement region, outside the regions where the cable screen is removed, grounding the tubular electrical conductors on their ends facing away from the measurement region, and arranging toroids of magnetizable material around the two tubular electrical conductors.

3. A method according to claim 2, further including providing the toroids with ferrite as magnetizable material.

4. A method according to claim 1 further including leaving a layer of semiconducting material between the annular outer electrode and the cable screen, and arranging two annular, grounded shielding electrodes in contact with the semiconducting layer.

5. A method according to claim 1 further including connecting the sound-recording device to a voltage source which is adapted to energize the inner conductor of the cable, whereby the voltage source is shut off if the sound-recording device records an acoustic signal which may be related to an electrical flashover or a breakdown in a measurement arrangement.

6. A device for space-charge measurement in a coaxial cable having an inner conductor, a cable screen, an electric insulation between the inner conductor and the cable screen and an impedance between the inner and outer conductors, comprising an electric pulse generator for generating an electric voltage pulse, means for applying the voltage pulse over part of the insulation of the cable in a measurement range which is defined by removing the cable screen on both sides of the measurement range, whereby the voltage pulse in the presence of space charges within the measurement range gives rise to an acoustic signal, and a sound-recording device for recording any acoustic signal, wherein the means for applying the voltage pulse is adapted to apply the voltage pulse to the cable screen on both sides of the measurement region, the voltage pulse is connected, via the impedance of the cable, to the inner conductor of the cable, a grounded annular outer electrode is disposed around the measurement region, and the sound-recording device is arranged in direct contact with the annular outer electrode such that a pulse-shaped voltage will lie between the inner conductor of the cable and the annular outer electrode.

7. A device according to claim 6, further comprising two tubular electrical conductors, arranged on both sides of the measurement region, outside the region where the cable screen is removed, said conductors being grounded on their ends facing away from the measurement region, and a toroid of magnetizable material arranged around each tubular electrical conductor.

8. A device according to claim 6 wherein the magnetizable material of the toroids comprises ferrite.

9. A device according to claim 6 wherein the cable has a layer of semiconducting material between the annular outer electrode and the cable screen further comprising two annular, grounded shielding electrodes connected to the layer.

10. A device according to claim 6 wherein wherein the sound-recording device is connected to the voltage source for the inner conductor of the cable such that the voltage source is shut off if the sound-recording device records an acoustic signal which may be related to electrical flashover or breakdown in a measurement arrangement.

11. A device for space-charge measurement in a coaxial cable having an inner conductor, a cable screen and an electric insulation therebetween and an impedance between the inner and outer conductors comprising:

an electric pulse generator for generating an electric voltage pulse, means for applying the voltage pulse at ends of a selected length of the insulation of the cable in a measurement range defined by an exposed portion of the insulation corresponding to said length wherein the voltage pulse in the presence of the space charges within the measurement range produces acoustic signals, and a sound-recording device for recording the acoustic signals wherein the voltage pulse is connected, via the impedance of the cable, to the inner conductor thereof;

a grounded annular outer electrode disposed around the cable at each end of the measurement region, and the sound-recording device being arranged in direct contact with the annular outer electrode such that a pulse-shaped voltage will lie between the inner conductor of the cable and the annular outer electrode.

12. A device according to claim 11 further including a tubular electrical conductor for each end of the measurement region disposed beyond ends of the region where the cable screen is removed, and said conductors being grounded on at ends proximate the corresponding ends of the measurement region.

13. A device according to claim 12 further including a toroid formed of magnetizable material arranged around each tubular electrical conductor.

14. A device according to claim 13 wherein the magnetizable material of the toroids is ferrite.

15. A device according to claim 12 wherein the annular outer electrode and the cable screen and the two annular, grounded shielding electrodes are connected to the exposed portion of the insulation layer.

16. A device according the claim 12 wherein the sound-recording device is connected to the voltage source for the inner conductor of the cable such that the voltage source is shut off if the sound-recording device records an acoustic signal corresponding to a potential electrical flashover or breakdown.

* * * * *